United States Patent

Satitpunwaycha et al.

Patent Number: 6,045,666
Date of Patent: Apr. 4, 2000

[54] ALUMINUM HOLE FILLING METHOD USING IONIZED METAL ADHESION LAYER

[75] Inventors: Peter Satitpunwaycha, Santa Clara; Gongda Yao; Kenny King-Tai Ngan, both of Fremont; Zheng Xu, Foster City, all of Calif.

[73] Assignee: Applied Materials, Inc., Santa Clara, Calif.

[21] Appl. No.: 08/977,007

[22] Filed: Nov. 24, 1997

Related U.S. Application Data

[63] Continuation of application No. 08/679,547, Jul. 12, 1996, abandoned, which is a continuation-in-part of application No. 08/628,835, Apr. 5, 1996, which is a continuation-in-part of application No. 08/511,825, Aug. 7, 1995, Pat. No. 0,596,923.

[51] Int. Cl.[7] .................................................. C23C 14/34
[52] U.S. Cl. .............................. 204/192.17; 204/192.12; 204/192.15
[58] Field of Search ........................ 204/192.12, 192.15, 204/192.17, 192.22, 192.23, 298.25; 438/660

[56] References Cited

U.S. PATENT DOCUMENTS

| | | | |
|---|---|---|---|
| 3,437,864 | 4/1969 | Kofoid et al. | 313/231 |
| 3,616,452 | 10/1971 | Bessot et al. | 204/298 |
| 3,619,403 | 11/1971 | Gorin | 204/312 |
| 3,649,502 | 3/1972 | Herte et al. | 204/192 |
| 3,699,034 | 10/1972 | Lins et al. | 204/192 |
| 3,705,091 | 12/1972 | Jacob | 204/312 |
| 3,873,884 | 3/1975 | Gabriel | 315/267 |
| 3,875,068 | 4/1975 | Mitzel | 250/531 |
| 3,879,597 | 4/1975 | Bersin et al. | 219/121 |
| 4,123,316 | 10/1978 | Tsuchimoto | 156/643 |
| 4,233,109 | 11/1980 | Nishizawa | 156/643 |
| 4,351,712 | 9/1982 | Cuomo et al. | 204/192 |
| 4,362,632 | 12/1982 | Jacob | 422/183.04 |
| 4,368,092 | 1/1983 | Steinberg et al. | 156/345 |
| 4,421,592 | 12/1983 | Shuskus et al. | 156/613 |
| 4,431,898 | 2/1984 | Reinberg et al. | 219/121 |
| 4,431,901 | 2/1984 | Hull | 219/121 |
| 4,668,338 | 5/1987 | Maydan et al. | 156/643 |

(List continued on next page.)

FOREIGN PATENT DOCUMENTS

| | | | |
|---|---|---|---|
| 84402320 | 11/1984 | European Pat. Off. | H01L 21/306 |
| 90119065 | 10/1990 | European Pat. Off. | H01J 37/32 |
| 91120777 | 12/1991 | European Pat. Off. | H01J 37/32 |
| 2110668 | 9/1971 | Germany | C23C 15/00 |
| 51-160638 | 12/1976 | Japan | H01L 21/032 |
| 58-63139 | 4/1983 | Japan | C23C 15/00 |
| 59-186955 | 9/1984 | Japan | H01L 21/205 |
| 62-152183 | 6/1987 | Japan | C23C 16/50 |
| 8102420 | 1/1981 | United Kingdom | H01J 27/18 |
| 9004980 | 6/1990 | United Kingdom | H01J 37/32 |
| 41723/71 | 9/1991 | United Kingdom | H01J 27/00 |
| PCT/AU86/00121 | 5/1986 | WIPO | H05H 1/46 |

OTHER PUBLICATIONS

Rossnagel et al., "Metal ion deposition from ionized magnetron sputtering discharge", J. Vac. Sci. Technol. B. 12(1), pp. 449–453, Feb. 1994.

Mei et al., "Nonconformal Al via filling and planarization by partially ionized beam deposition for multilevel interconnection," *IEEE Electron Device Letters*, vol. EDL–8, NO. 10, 1987, pp. 505–505.

Macalpine et al, Coaxial Resonators with Helical Inner Conductor, Dec. 1959 Issue of Proceedings of the IRE, pp. 2099–2105.

(List continued on next page.)

*Primary Examiner*—Nam Nguyen
*Assistant Examiner*—Gregg Cantelmo
*Attorney, Agent, or Firm*—Charles S. Guenzer

[57] ABSTRACT

A hole filling process for an integrated circuit in which wiring levels in the integrated circuit are connected by a narrow hole, especially where the underlying level is silicon. First, a physical vapor deposition (PVD) process fills a barrier tri-layer into the hole. The barrier tri-layer includes sequential layers of Ti, TiN, and graded $TiN_x$, grown under conditions of a high-density plasma. Thereafter, a first aluminum layer is PVD deposited under conditions of a high-density plasma. A filling aluminum layer is then deposited by standard PVD techniques.

31 Claims, 6 Drawing Sheets

U.S. PATENT DOCUMENTS

| | | | |
|---|---|---|---|
| 4,668,365 | 5/1987 | Foster et al. | 204/192.23 |
| 4,686,113 | 8/1987 | Delfino et al. | 427/45.1 |
| 4,716,491 | 12/1987 | Ohno et al. | 361/230 |
| 4,810,935 | 3/1989 | Boswell | 315/111.41 |
| 4,844,775 | 7/1989 | Keeble | 156/643 |
| 4,849,675 | 7/1989 | Muller | 315/111.51 |
| 4,859,908 | 8/1989 | Yoshida et al. | 315/111.81 |
| 4,911,814 | 3/1990 | Matsuoka et al. | 204/298 |
| 4,918,031 | 4/1990 | Flamm et al. | 437/225 |
| 4,948,458 | 8/1990 | Ogle | 156/643 |
| 4,951,601 | 8/1990 | Maydan et al. | 118/719 |
| 4,990,229 | 2/1991 | Campbell et al. | 204/298.06 |
| 4,999,096 | 3/1991 | Nihei et al. | 204/192.3 |
| 5,018,479 | 5/1991 | Markunas et al. | 118/723 |
| 5,108,570 | 4/1992 | Wang | 204/192.3 |
| 5,146,137 | 9/1992 | Gesche et al. | 315/111.21 |
| 5,171,412 | 12/1992 | Talieh et al. | 204/192.15 |
| 5,178,739 | 1/1993 | Barnes et al. | 204/192.12 |
| 5,186,718 | 2/1993 | Tepman et al. | 29/25.01 |
| 5,225,740 | 7/1993 | Ohkawa | 315/111.41 |
| 5,231,334 | 7/1993 | Paranjpe | 315/111.21 |
| 5,240,880 | 8/1993 | Hindman et al. | 204/192.17 |
| 5,338,423 | 8/1994 | Hindman et al. | 204/192.12 |
| 5,354,443 | 10/1994 | Moslehi | 204/192.12 |
| 5,358,616 | 10/1994 | Ward | 204/192.15 |
| 5,371,042 | 12/1994 | Ong | 437/194 |
| 5,378,660 | 1/1995 | Ngan et al. | 437/247 |
| 5,397,962 | 3/1995 | Moslehi | 315/111.51 |
| 5,430,355 | 7/1995 | Paranjpe | 315/111.21 |
| 5,435,881 | 7/1995 | Ogle | 156/345 |
| 5,658,828 | 8/1997 | Lin et al. | 204/192.17 |
| 5,665,659 | 9/1997 | Lee et al. | 204/192.22 |

OTHER PUBLICATIONS

Aston et al, Ion Beam Divergence Characteristics of Two–Grid Accelerator Systems, May 1978 AIAA Journal vol. 16, #5, pp. 516–524.

Sakudo et al, Microwave Ion Source, Jul. 1977 Review of Scientific Instruments, vol. 48, #7, pp. 762–766.

Matsuzawa et al, Direct Anodization of GaAs and Si at Extremely Low Substrate Temperature by Low Pressure Oxygen Plasma, Jul./Aug. 1980 Journal of Vacuum Science & Technology, pp. 793–795.

Takuo Sugano, Ed., Applications of Plasma Processes to VLSI Technology, 1982–1985.

Boswell et al, Some Features of RF Excited Fully Ionized Low Pressure Argon Plasma, Sep. 6, 1982 Physics Letters, vol. 91A, #4, pp. 163–166.

Rossnagel, Directional And Ionized Sputter Deposition For Microelectronics Applications, 1995 Proceedings of the 3rd ISSP, pp. 253–260.

Rossnagel, Filling Dual Damascene Interconnect Structures With AlCu and Cu Using Ionized Magnetron Deposition, Jan./Feb. 1995 Journal of Vacuum Science & Technology B, vol. 13, #1, pp. 125–129.

Peter Burggraaf, Ed., Straightening Out Sputter Deposition, Aug. 1995 Semiconductor International, pp. 69, 70, 72, 74.

Pramanik et al., Barrier Metals for VLSI: Deposition and Manufacturing, Solid State Technology, Jan. 1993, pp. 73–76, 78–79, 82.

Kim et al, *The Effect of Reactive–sputtered TiN on Electromigration of Al Alloy Metallization,* Proceedings IEEE VMIC Conference, Jun. 27–29, 1995 (104/95/0443), p. 443.

Campbell et al, Relationship Between Texture and Electromigration Lifetime in Sputtered Al–1% Si Thin Films, Journal of Electronic Materials, vol. 22, 1993, pp. 589–596.

Kordic et al, Correlation Between Stress Voiding of Al(Si, Cu) Metallizations and Crystal Orientation of Aluminum Grains, Journal of Applied Physics, vol. 74, 1993, pp. 5391–5394.

Hopwood et al, Langmuir Probe Measurements of a Radio Frequency Induction Plasma, Journal of Vacuum Science and Technology A, vol. 11, 1993, pp. 152–156.

Knorr et al, The role of texture in the Electromigration Behavior in Pure Aluminum Films, Journal of Applied Physics, vol. 79, 1996, pp. 2409–2417.

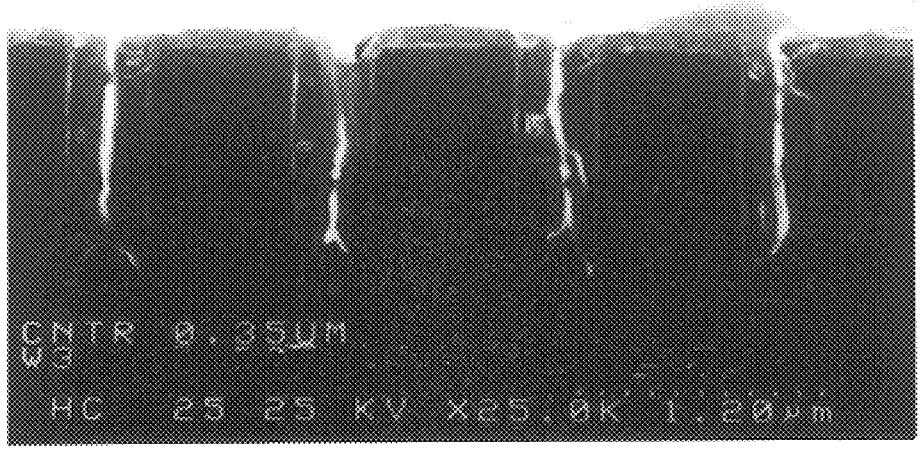
FIG._5
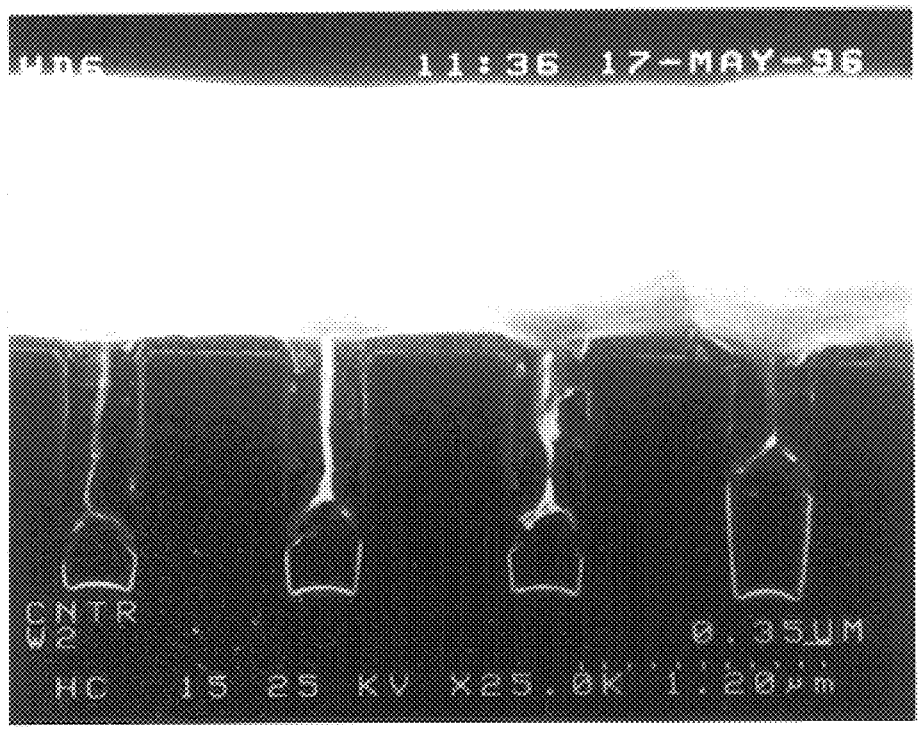
FIG._6

ALUMINUM HOLE FILLING METHOD USING IONIZED METAL ADHESION LAYER

RELATED APPLICATIONS

This application is a continuation of U.S. patent application, Ser. No. 08/679,547 now abandoned issued Jul. 12, 1996 which is a continuation in part of U.S. patent application, Ser. No. 08/628,835, filed Apr. 5, 1996, which is a continuation in part of U.S. patent application, Ser. No. 08/511,825, filed Aug. 7, 1995, now U.S. Pat. No. 5,962,923, issued Oct. 5, 1999.

FIELD OF THE INVENTION

The invention relates generally to semiconductor integrated circuits. In particular, the invention relates to a barrier layer formed between a metal and a semiconductor, and the covering of the barrier layer with a conductor.

BACKGROUND OF THE INVENTION

Modern semiconductor integrated circuits usually involve multiple layers separated by dielectric (insulating) layers, such as of silicon dioxide or silica, often referred to simply as an oxide layer, although other materials are being considered for the dielectric. The layers are electrically interconnected by holes penetrating the intervening oxide layer which contact some underlying conductive feature. After the holes are etched, they are filled with a metal, such as aluminum, to electrically connect the bottom layer with the top layer. The generic structure is referred to as a plug. If the underlying layer is silicon or polysilicon, the plug is a contact. If the underlying layer is a metal, the plug is a via.

Plugs have presented an increasingly difficult problem as integrated circuits are formed with an increasing density of circuit elements because the feature sizes have continued to shrink. The thickness of the oxide layer seems to be constrained to the neighborhood of 1 $\mu$m, while the diameter of the plug is being reduced from the neighborhood of 0.25 $\mu$m or 0.35 $\mu$m to 0.18 $\mu$m and below. As a result, the aspect ratios of the plugs, that is, the ratio of their depth to their minimum lateral dimension, is being pushed to 5:1 and above.

Filling such a hole with a metal presents two major difficulties.

The first difficulty is filling such a hole without forming an included void, at least with a filling process that is fast enough to be economical and at a low enough temperature that doesn't degrade previously formed layers. Any included void decreases the conductivity through the plug and introduces a substantial reliability problem. Chemical vapor deposition (CVD) is well known to be capable of filling such narrow holes with a metal, but CVD is considered to be too slow for a complete filling process. Physical vapor deposition (PVD), alternatively called sputtering, is the preferred filling process because of its fast deposition rates. However, PVD does not inherently conformally coat a deep and narrow hole. A fundamental approach for applying PVD to deep holes is to sputter the metal on a hot substrate so that the deposited material naturally flows into the narrow and deep feature. This process is typically referred to as reflow. However, high-temperature reflow results in a high thermal budget, and in general the thermal budget needs to be minimized for complex integrated circuits. Further, even at high temperatures, the metal does not always easily flow into a very narrow aperture.

The second difficulty is that an aluminum contact is not really compatible with the underlying semiconductive silicon. At moderately high temperatures, such as those required for the reflow of aluminum into the narrow hole, aluminum tends to diffuse into the silicon and to severely degrade its semiconductive characteristics. Accordingly, a diffusion barrier needs to be placed between the aluminum and the underlying silicon.

These problems are well known and have been addressed by Xu et al. in U.S. patent application, Ser. No. 08/628,835, filed Apr. 5, 1996, incorporated herein by reference in its entirety, which is a continuation in part of U.S. patent application, Ser. No. 08/511,825, filed Aug. 7, 1995.

As shown in the cross-sectional view of FIG. 1, a contact hole 10 having an aspect ratio defined by its depth 12 and its width 14 is etched through a dielectric layer 16 to an underlying substrate 18, which in the more difficult situation includes a surface layer of silicon. In the hole filling process, the contact hole 10 is conformally coated with a titanium (Ti) layer 20, a titanium nitride (TiN) layer 22, and a graded ($TiN_x$) layer 24, that is, the graded layer 24 begins at its bottom as TiN but its top portion is nearly pure Ti. These three layers form a tri-layer barrier 26, which provides both the conformality and the adhesion to the underlying layers, as well as sufficient wetting for the after deposited aluminum. The Ti layer 20, after siliciding at a sufficiently high annealing temperature, forms a good ohmic contact with the underlying silicon substrate 18. Thereafter, a metal layer 28 is sputter deposited into the hole 10 so as to fill it without voids. That is, the tri-layer barrier 26 sufficiently wets to the after filled aluminum that it readily flows into the hole 10 at a moderate temperature while the tri-layer barrier 26 nonetheless provide a sufficient diffusion barrier between the aluminum 28 and the underlying silicon 18.

According to Xu et al., the wetting quality of the three layers 20, 22, 24 is enhanced by depositing them in a high-density PVD reactor. On the other hand, they recommend that the aluminum layer 28 be sputter deposited in a conventional PVD chamber with a low plasma density. In particular, they recommend that the aluminum layer 28 be deposited as two layers in an improved two-step cold/warm version of a conventional sputtering process. In the first cold step, a seed layer 30 of aluminum is sputter deposited at a substrate temperature below 200° C. so as to conformally coat the underlying barrier tri-layer 26 with a fairly uniform aluminum layer. In the second, warm step, a filling layer 32 of aluminum is sputter deposited at higher temperatures so as to reflow and fill the contact hole 10. An advantage of the tri-layer barrier 26 grown by ionized metal plating (IMP) is that the warm Al filling layer 32 can be filled at temperatures below 400° C., even as low as 350° C. according to the reported data. The warm layer 32 can be deposited at a fairly high rate so as to improve the system throughput. Because the two aluminum layers 30, 32 differ primarily in their different deposition temperatures, they are likely deposited within a single conventional PVD chamber capable only of developing a low-density plasma. Also, the two deposition can be performed continuously, with the temperature being ramped up during the deposition. As a result, the two Al layers 30, 32 have no clear boundary between them.

In the context of contact hole filling, a high-density plasma is defined in one sense as one substantially filling the entire volume it is in and having an average ion density of greater than $10^{11} cm^{-3}$ in the principal part of the plasma. The conventional plasma-enhanced PVD reactor produces a plasma of significantly lower ion density. Although high-density plasmas are available in a number of different types of reactors, they are preferably obtained in inductively coupled plasma reactor, such as the type shown in schematical cross section in FIG. 2. For reasons to be described shortly, this is referred to an ionized metal plasma or plating (IMP) reactor.

As shown in this figure, which is meant only to be schematical, a vacuum chamber 40 is defined principally by a chamber wall 42 and a target backing plate 44. A PVD target 46 is attached to the target backing plate 44 and has a composition comprising at least part of the material being sputter deposited. For the deposition of both titanium (Ti) and titanium nitride (TiN), the target 46 is made of titanium. A substrate 48 being sputter deposited with a layer of a PVD film is supported on a pedestal electrode 50 in opposition to the target 46. Processing gas is supplied to the chamber 40 from gas sources 52, 54 as metered by respective mass flow controllers 56, 58, and a vacuum pump system 60 maintains the chamber 40 at the desired low pressure.

An inductive coil 62 is wrapped around the space between the target 46 and the pedestal 50. Three independent power supplies are used in this type of inductively coupled sputtering chamber. A DC power supply 64 negatively biases the target 46 with respect to the pedestal 50. An RF power source 66 supplies electrical power in the megahertz range to the inductive coil 62. The DC voltage applied between the target 46 and the substrate 48 causes the processing gas supplied to the chamber to discharge and form a plasma. The RF coil power inductively coupled into the chamber 40 by the coil 62 increases the density of the plasma, that is, increases the density of ionized particles. Magnets 68 disposed behind the target 46 significantly increase the density of the plasma adjacent to the target 46 in order to increase the sputtering efficiency. Another RF power source 70 applies electrical power in the frequency range of 100 kHz to a few megahertz to the pedestal 50 in order to bias it with respect to the plasma.

Argon from the gas source 54 is the principal sputtering gas. It ionizes in the plasma, and its positively charged ions are attracted to the negatively biased target 46 with enough energy that the ions sputter particles from the target 46, that is, target atoms or multi-atom particles are dislodged from the target. The sputtered particles travel primarily along ballistic paths, and some of them strike the substrate 48 to deposit upon the substrate as a film of the target material. If the target 46 is titanium or a titanium alloy and assuming no further reactions, a titanium film is thus sputter deposited, or in the case of an aluminum target, an aluminum film is formed.

For the sputter deposition of TiN in a process called reactive sputtering, gaseous nitrogen is also supplied into the chamber 40 from the gas source 52 along with the argon. The nitrogen chemically reacts with the surface layer of titanium being deposited on the substrate to form titanium nitride.

As Xu et al. describe in the cited patent application, a high-density plasma, primarily caused by the high amount of coil power applied to the chamber 40, increases the fraction of the sputter species that become ionized as they traverse the plasma, hence the term ionized metal plating. The wafer bias power applied to the pedestal 50 causes the pedestal 50 to become DC biased with respect to the plasma, the voltage drop occurring in the plasma sheath adjacent to the substrate 48. Thus, the bias power provides a tool to control the energy and directionality of the sputter species striking the substrate 48.

Xu et al. disclose that the $Ti/TiN/TiN_x$ barrier tri-layer 26 should be deposited in an ionized metal plating (IMP) process in which the various power levels are set to produce a high-density plasma. They observe that an IMP barrier tri-layer 26 as shown in FIG. 1, when deposited in the contact hole 10, promotes the reflow of aluminum into the contact hole 10 when the aluminum is subsequently deposited in a conventional PVD reactor, that is, one not using inductively coupled RF power and not producing a high-density plasma. This superior reflow is believed to require two characteristics in a narrow aperture. The barrier layer needs to adhere well to the underlying $SiO_2$ or Si so as to form a continuous, very thin film. The aluminum needs to wet well to the barrier layer so that it flows over the barrier layer at relatively low temperatures.

Although the TiN IMP barrier tri-layer offers significant advantages in promoting reflow of subsequently deposited conventional PVD aluminum, as processing requirements become even more demanding, further improvement of reflow into narrow apertures is desired.

SUMMARY OF THE INVENTION

The invention can be summarized as a method of filling a narrow hole and the structure resultant therefrom in which the hole is first filled with a barrier layer comprising one or more layers of TiN or other refractory metal materials. Thereafter, a non-refractory metal, such as aluminum is coated into the hole with an ionized metal process (IMP), that is, in the presence of a high-density plasma. Thereafter, the remainder of the hole is filled with a standard PVD process involving a low-density plasma.

BRIEF DESCRIPTION OF THE DRAWINGS

FIG. 5 is a scanning electron micrograph (SEM) of a contact of the invention.

FIG. 6 is a SEM of a contact of the prior art showing the formation of voids.

DETAILED DESCRIPTION OF THE PREFERRED EMBODIMENTS

Figure 1:
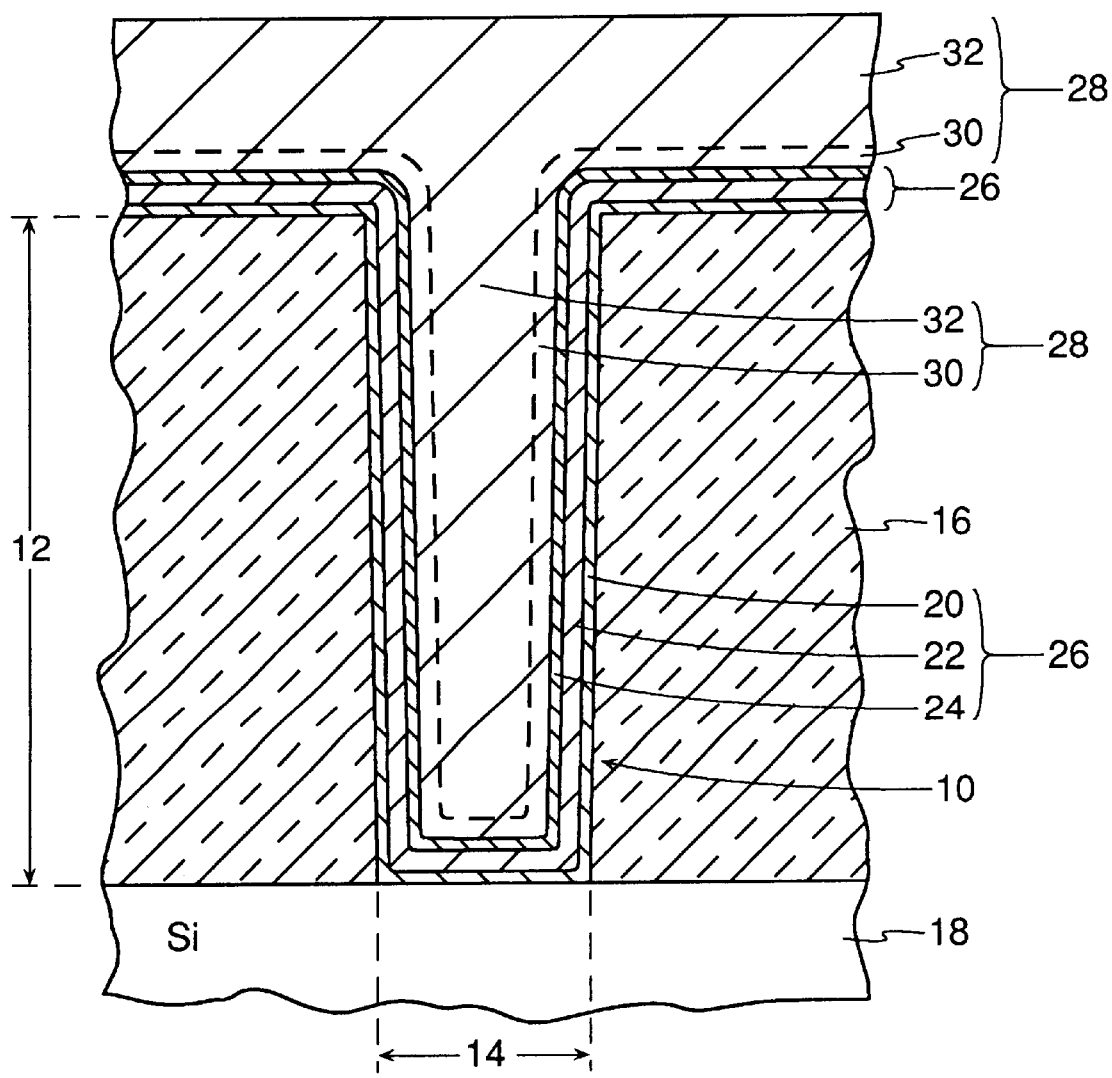
FIG. 1 is a schematical cross-sectional view of a known type of contact in an integrated circuit.
Figure 3:
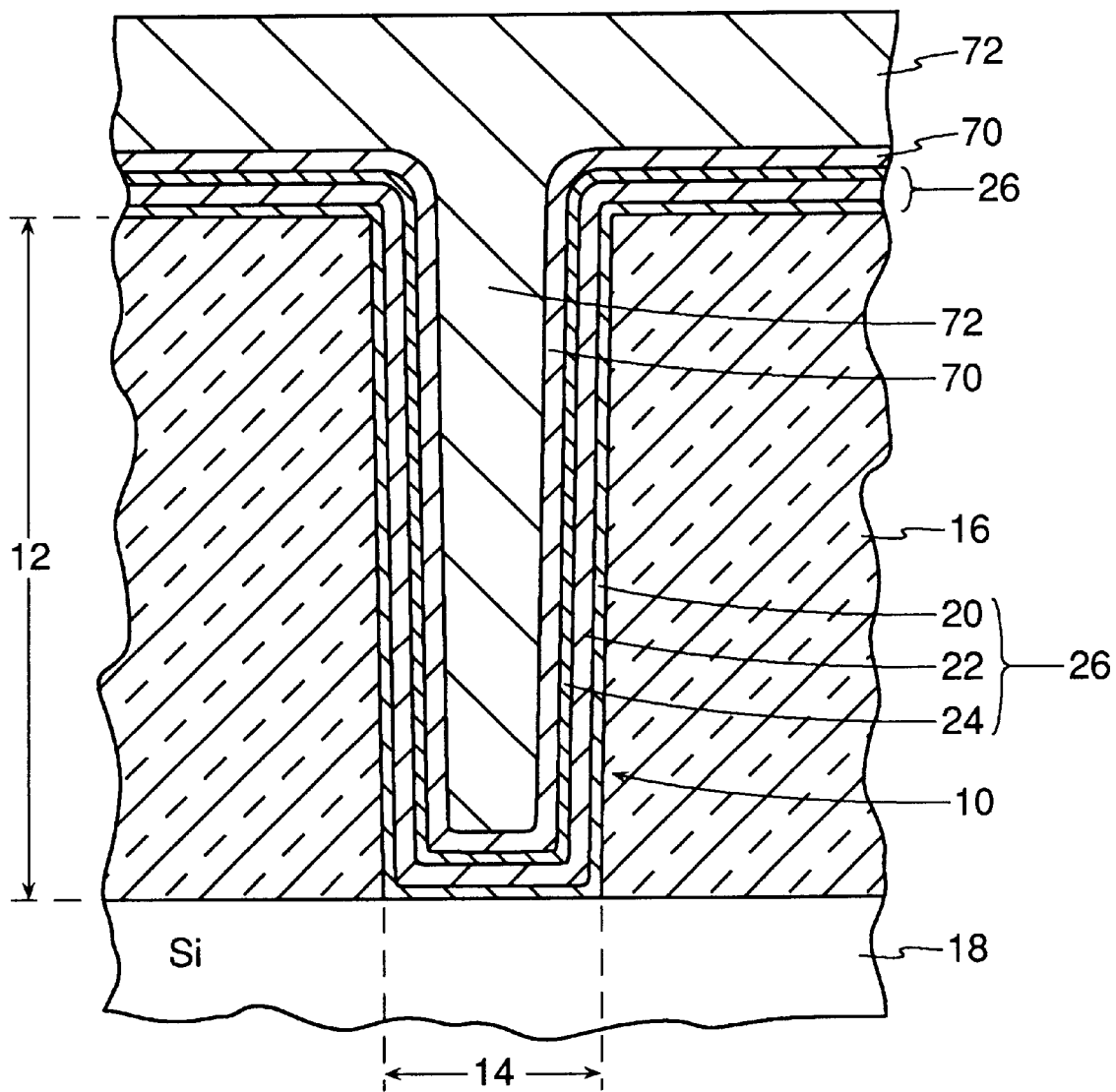
FIG. 3 is a schematical cross-sectional view of a contact in an integrated circuit according to the invention.

A contact formed according to the invention is illustrated in cross section in FIG. 3. The contact is formed in the contact hole 10 etched in the oxide layer 16 overlying the silicon surface of the substrate 18. Just as in Xu et al.'s structure illustrated in FIG. 1, an IMP barrier tri-layer 26 is deposited into the contact hole 10. The barrier tri-layer includes a Ti layer 20, a TiN layer 22, and a graded $TiN_x$ layer 24, all sputtered in a high-density plasma by an ionized metal plating (IMP) process.

Figure 2:
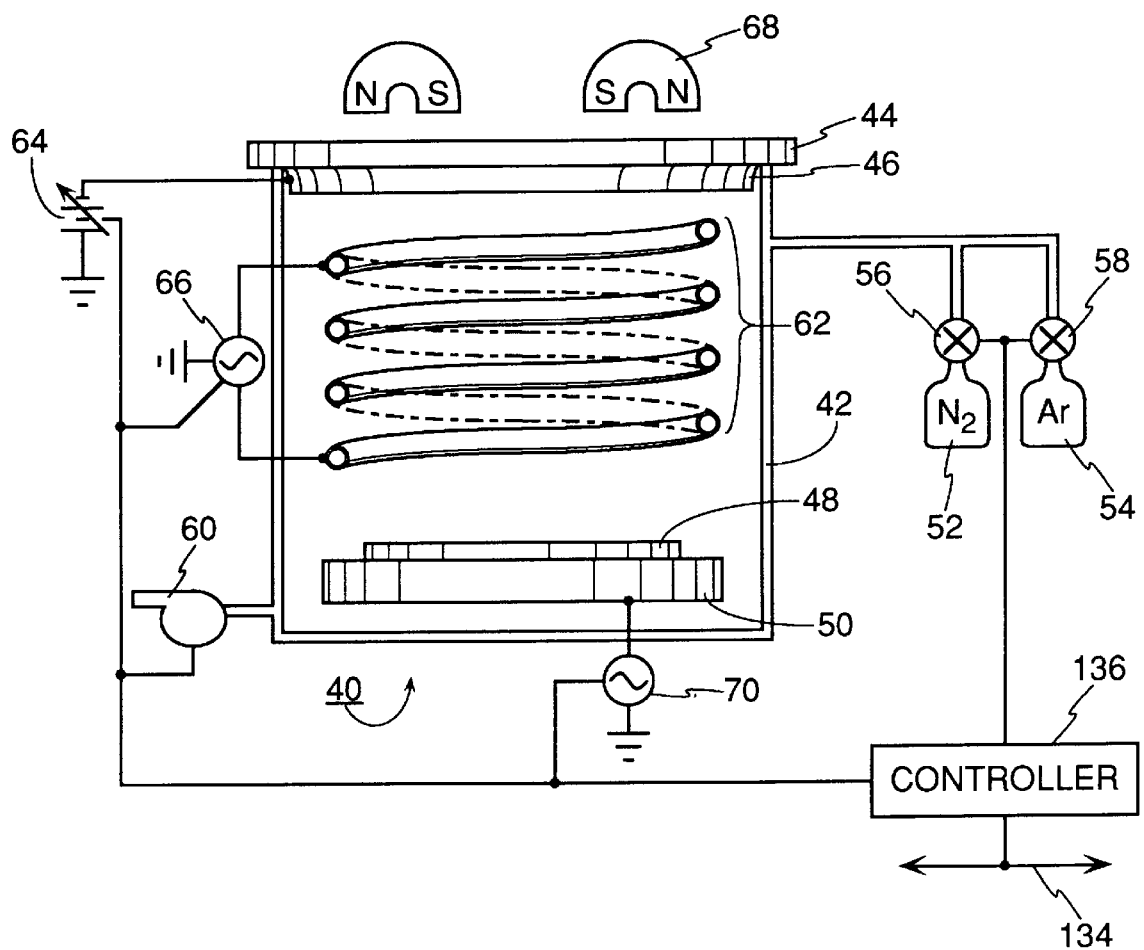
FIG. 2 is a schematical side illustration of a ionized metal process (IMP) reactor for physical vapor deposition (PVD).

According to the invention, an IMP aluminum layer 70 is sputter deposited over the barrier tri-layer 26 in an IMP process, that is, in a high-density plasma, for example as practiced in the reactor of FIG. 2. A standard aluminum layer 72 is sputter deposited over the IMP aluminum layer 70, preferably by a conventional PVD process utilizing a low-density plasma. The IMP aluminum layer 70 is easily conformally coated into the contact hole 10 and forms a seed layer for the after-deposited aluminum filler layer 72. Advantageously, the IMP aluminum layer 70 can be deposited at near to room temperature, and the aluminum filler layer 72 can effectively fill the contact hole 10 at relatively low deposition temperatures. That is, the total process has a low thermal budget. Nonetheless, the contact hole is effectively filled and planarized.

Figure 4:
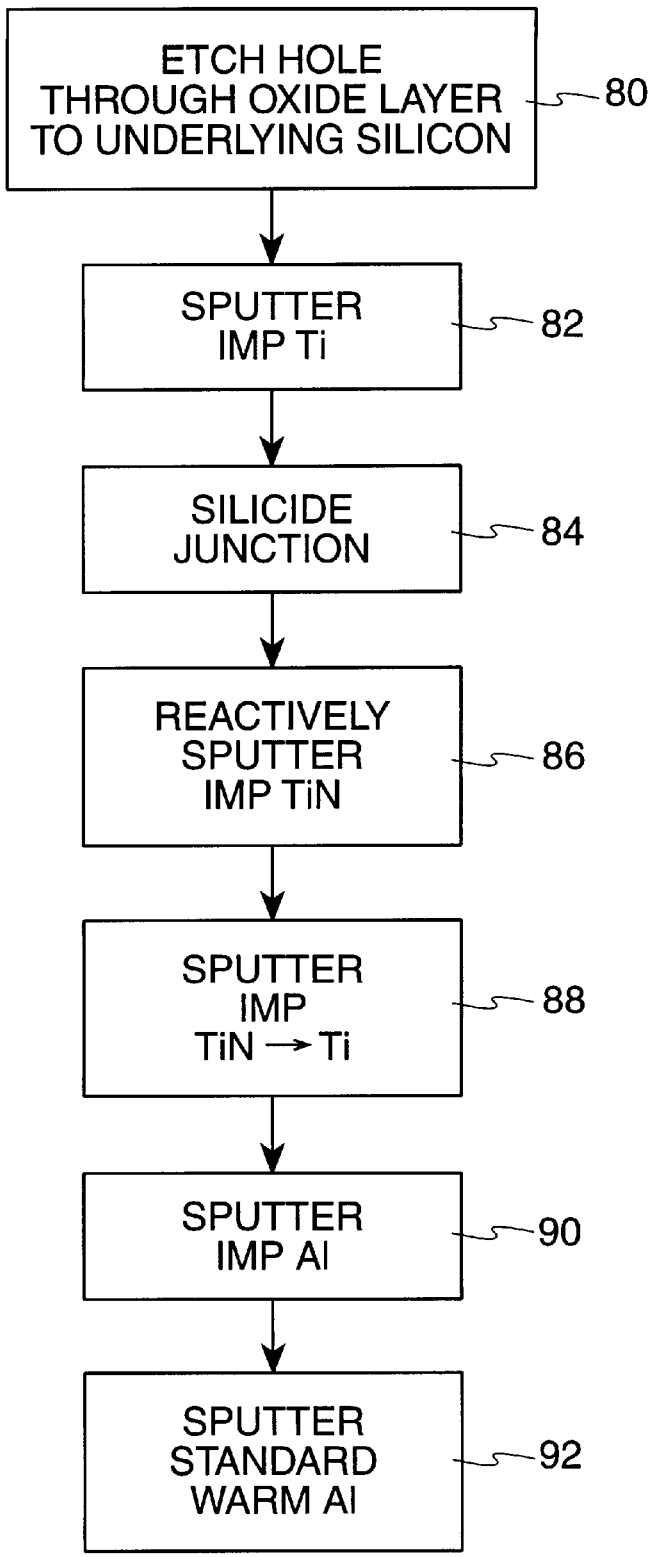
FIG. 4 is a flow diagram of an aluminum hole filling process incorporating the invention.

The complete processing sequence for a preferred processing embodiment of the invention is shown by the flow diagram of FIG. 4. In step 80, a contact hole is etched through the overlying oxide layer to the underlying substrate having at least a silicon surface in the vicinity of the contact hole. After some cleaning steps described in the example below, in step 82, an IMP PVD chamber sputter deposits a titanium layer into the hole. In step 84, the titanium layer is annealed so as be silicided to the underlying silicon. In step 86, an IMP PVD chamber reactively sputters a layer of TiN over the titanium layer in the contact hole by additionally admitting nitrogen into the reaction chamber. In step 88, the PVD chamber sputter deposits the graded TiN$_x$ layer onto the TiN layer. This is most typically accomplished by cutting off the supply of nitrogen from the previous step 86, and the residual nitrogen in the chamber or embedded in the Ti target is gradually depleted until a pure Ti layer is being deposited. In step 90, the wafer is transferred to another IMP PVD chamber in which a layer of aluminum is deposited by IMP. In step 92, the wafer is transferred to a standard PVD chamber, which deposits an aluminum filling layer in a standard warm process.

EXAMPLE

Contact holes were etched through a dielectric layer of SiO$_2$ having a thickness of 1.2 $\mu$m. The contact holes had diameters of 0.35 $\mu$m. Thus, the contact hole had an aspect ratio of 3.5:1. Prior to the PVD deposition, the etched wafer was subjected to one minute of PVD degassing and a pre-cleaning which removed an equivalent of 25 nm of oxide.

The wafer was then transferred into a first IMP chamber, such as that illustrated in FIG. 2, for deposition of the barrier tri-layer. The titanium target was DC biased at 6 kW, the coil was RF biased at 1.5 kW, and the pedestal during the titanium process was sufficiently RF biased to create about a −50 V DC bias with respect to the plasma. The tri-layer was then formed having a titanium thickness of 20 nm, a TiN thickness of 80 nm, and a TiN$_x$ thickness of about 10 nm resulting from a 5 sec titanium sputter after cutoff of the nitrogen.

The wafer was then transferred to another IMP chamber having an aluminum target. The biasing conditions were the same except that no bias was applied to the pedestal. (The presence of bias on the pedestal was demonstrated to have little effect.) Argon was maintained at a pressure of 30 mTorr in the chamber while 200 nm of aluminum was sputter deposited by the IMP process.

Thereafter, the wafer was transferred to a conventional PVD chamber where a layer of warm aluminum was deposited by traditional sputter deposition. The layer of warm aluminum had a thickness of 1.5 $\mu$m as measured on a planar surface, and it was deposited with the substrate held at a temperature of about 375° C.

The resulting structure was sectioned and examined with a scanning electron microscope (SEM). The micrograph is shown in FIG. 5. In all cases, the warm aluminum completely filled the contact holes with no voids. The vertical feature seen in the top center and the tent structure seen at the bottom of the contact holes are artifacts of the SEM.

COMPARATIVE EXAMPLE

A comparative test was performed with the general structure suggested by Xu et al. That is, the IMP aluminum layer of the invention was replaced by a warm standard PVD aluminum layer deposited at near to room temperature in a low-density plasma. Also, the pedestal was RF biased to create a DC self bias of −50 V.

The resulting micrograph is shown in FIG. 6. In all cases, significant voids have developed at the bottom of the contact holes, in one of the four contacts extending half way up the hole. The voids indicate that there was insufficient reflow with the warm aluminum. Such voids are unacceptable in a commercial process because of the high contact resistance they produce. These experimental results should not be interpreted to mean that the process of Xu et al. cannot be optimized for the structure and composition of the two examples, but the results do show that, for at least one combination, the IMP aluminum layer provides a better seed layer than the conventional PVD cold aluminum layer.

Figure 7:
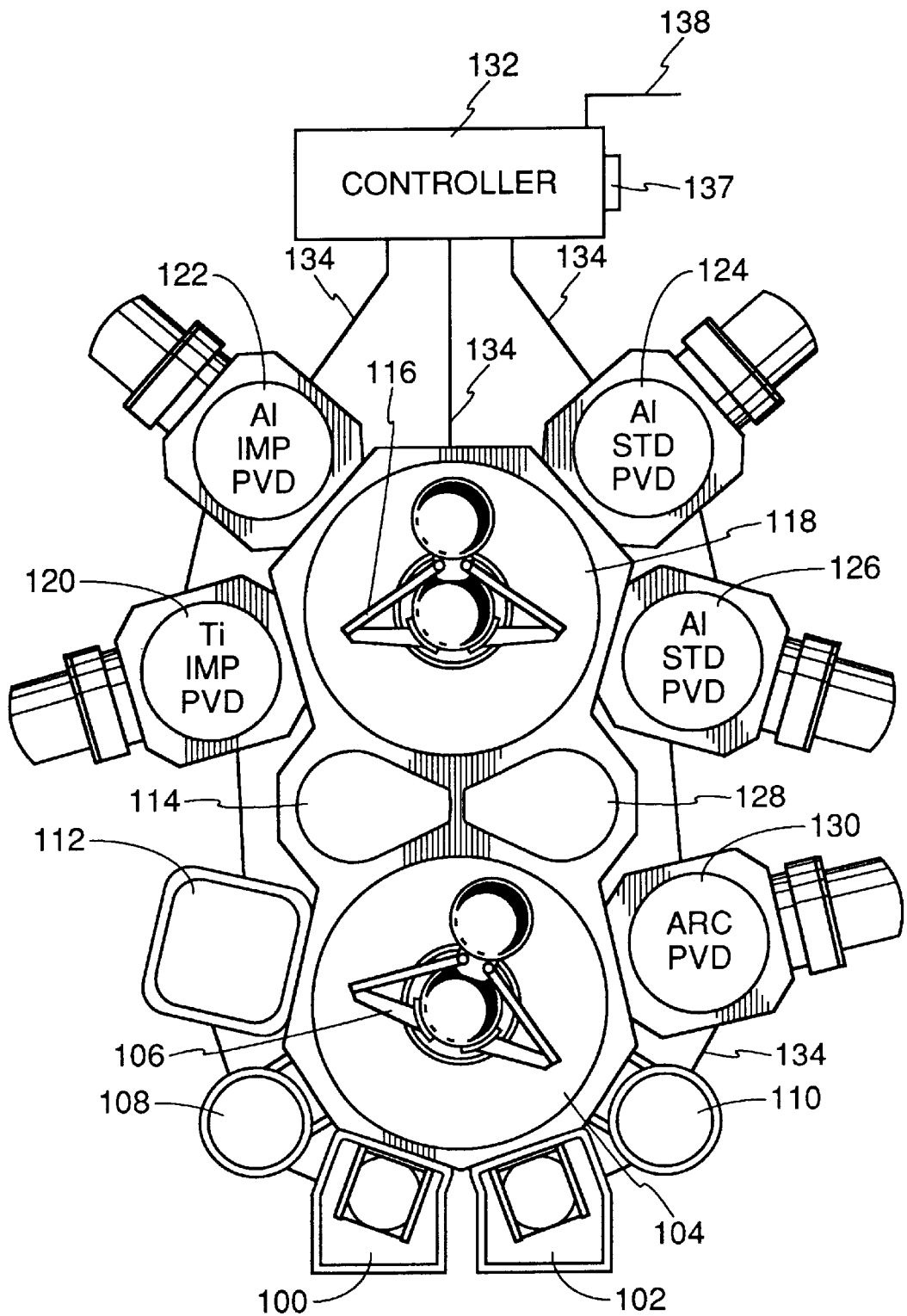
FIG. 7 is a schematical plan view of an integrated processing tool incorporating various reaction chambers usable with the invention.

The invention is preferably practiced on an integrated multi-chamber tool, such as the Endura® 5500 platform illustrated in plan view in FIG. 7, which is functionally described by Tepman et al. in U.S. Pat. No. 5,186,718.

Wafers are loaded into the system by two independently operated loadlock chambers 100, 102 configured to transfer wafers into and out of the system from wafer cassettes loaded into the respective loadlock chambers. The pressure of a first wafer transfer chamber 104 to which the loadlocks can be selectively connected via unillustrated slit valves can be regulated between the atmospheric or somewhat lower pressure of the cassette to a moderately low pressure, for example, in the range of $10^{-3}$ to $10^{-4}$Torr. After pumpdown of the first transfer chamber 104 and of the selected loadlock chamber 100, 102, a first robot 106 located in the first transfer chamber 104 transfers the wafer from the cassette to one of two wafer orienters 108, 110 and then to a degassing orienting chamber 112. The first robot 106 then passes the wafer into an intermediately placed plasma preclean chamber 114, from whence a second robot 116 transfers it to a second transfer chamber 118, which is kept at a significantly lower pressure, preferably below $10^{-7}$Torr and typical 2×10$^-$sTorr. The second robot 116 selectively transfers wafers to and from reaction chambers arranged around its periphery.

A first IMP PVD chamber 120 is dedicated to the deposition of the Ti-based barrier tri-layer. A second IMP PVD chamber 122 is dedicated to the deposition of the IMP aluminum layer. Two standard PVD chambers 124, 126 are dedicated to the deposition of the warm aluminum in a low-density plasma. It may be desirable to modify this configuration to have two IMP PVD chambers for titanium deposition and only one standard PVD chamber for the warm aluminum. Each of the chambers 120, 122, 124, 126 is selectively opened to the second transfer chamber 118 by unillustrated slit valves.

After the low-pressure PVD processing, the second robot 116 transfers the wafer to an intermediately placed cool-down chamber 128, from whence the first robot 106 withdraws the wafer and transfers it to a standard PVD chamber 130. This chamber deposits on the wafer a TiN layer of controlled thickness and dielectric constant, which serves as an anti-reflection coating (ARC) over the metal layers just deposited in the PVD chambers positioned around the second transfer chamber 118. The ARC layer facilitates photolithography of the highly reflective metal layers. After ARC deposition, the wafer is transferred to a cassette in one of the two loadlocks 100, 102. Of course, other configurations of the platform are possible with which the invention can be practiced.

The entire system is controlled by a controller 132 operating over a control bus 134 to be in communication with sub-controllers 136, as illustrated in FIG. 2, associated with each of the chambers. Process recipes are read into the controller 132 by recordable media 137, such as magnetic floppy disks or CD-ROMs, insertable into the controller 132, or over a communication link 138.

Many variations of the invention are possible, some of which are presented below.

Hole filling may be applied to other applications than contact holes, for example, trenches, wall structures for dynamic memories, or inter-layer vias. If the underlying material is a metal, the barrier layer can be simplified, perhaps with the elimination of either one or both of the Ti layer and the graded $TiN_x$ layer.

It is possible to deposit both of the aluminum layers in a single PVD reactor with the power supplies being changed between the two depositions to emphasize respectively a directional and conformal IMP deposition and a fast standard PVD deposition. It is also possible to achieve the IMP high-density plasma by means other than inductive coupling, e.g, electron cyclotron resonance, helicon couplers, or remote microwave plasma sources.

It is possible to deposit the filling aluminum layer in an IMP process even though this will require more time.

Since in the preferred arrangement of FIG. 7 the aluminum deposition is performed in two separate chambers, the composition of the aluminum target and hence of the resultant film may be advantageously varied. That is, it is well known to alloy aluminum with various alloying elements such as silicon and copper, and these alloying percentages may vary between the targets of the two chambers to obtain particularly advantageous metal layers.

Although the invention has been described in regard to preferred metallization of aluminum, it may be applied as well to other metals such as copper applied over the barrier layers. Of course, the after-deposited layer should have a substantially non-refractive composition so as to differ from the underlying barrier tri-layer based on titanium or other similar refractory metals, such as tantalum, cobalt, tungsten, and nickel.

Although the tri-layer structure is preferred, especially for silicon contacts, in some situations such as vias to inter-layer metal layers, it may not be necessary to include the titanium siliciding layer or the TiNx graded layer. Barrier layers of other compounds of refractory metals may be used with the invention.

The invention thus provides a way to assure that narrow inter-level hole are effectively filled with aluminum or other metals.

What is claimed is:

1. A method of filling a hole through a dielectric layer in an integrated circuit, comprising the steps of:

a first step of sputter depositing in said hole a first metal layer comprising a metallization metal under conditions of a high-density plasma, wherein said high-density plasma is a plasma substantially filling the entire volume it is in and having an average ion density of greater than $10^{11} cm^{-3}$ in a principal portion of said high-density plasma; and a second step of sputter depositing over said first metal layer a second metal layer comprising said metallization metal, wherein said second step is performed under conditions of a low-density plasma, wherein said low-density plasma has an average ion density of less than $10^{11} cm^{-3}$ in a principal portion of said low-density plasma.

2. The method of claim 1, wherein said metallization metal is a non-refractory metal.

3. The method of claim 2, wherein said metallization metal is aluminum.

4. The method of claim 1, wherein said hole is underlaid by a silicon surface layer.

5. The method of claim 1, further comprising a step of forming a barrier layer in said hole performed prior to said first step.

6. The method of claim 5, wherein said barrier layer comprises a refractory metal selected from the group consisting of titanium, tantalum, cobalt, tungsten, and nickel.

7. The method of claim 6, wherein said step of forming said barrier layer includes a PVD process involving high-density plasma.

8. The method of claim 6, wherein said barrier layer further comprises nitrogen.

9. The method of claim 6, wherein said refractory metal is titanium.

10. The method of claim 9, wherein said barrier layer further comprises nitrogen.

11. The method of claim 5, wherein said step of forming said barrier layer includes:

PVD depositing a layer of titanium;

then PVD depositing a layer of titanium nitride; and then PVD depositing a layer of graded titanium nitride.

12. The method of claim 11, wherein said step of forming said barrier layer is performed in a high-density plasma.

13. The method of claim 1, wherein the composition of said first layer differs from that of said second layer.

14. The method of claim 13, wherein said first and second layers comprise aluminum.

15. The method of claim 1, wherein said first step comprises inductively coupling RF energy into a plasma reactor chamber containing a substrate including said hole.

16. The method of claim 1, wherein said metallization metal is copper.

17. The method of claim 1, further comprising a step performed before said first step of depositing a third layer comprising a refractory metal selected from the group consisting of tantalum, cobalt, tungsten, and nickel.

18. The method of claim 17, wherein said refractory metal is tantalum.

19. The method of claim 18, wherein said metallization metal is copper.

20. A method of filling a hole formed in a dielectric layer of a substrate, comprising the sequential steps of:

a first step of PVD depositing a barrier layer comprising titanium and nitrogen covering the bottom and side walls of said hole;

a second step of PVD depositing in said hole a first metal layer comprising aluminum in a first plasma reactor utilizing inductive coupling of RF power into said first reactor; and a third step of PVD depositing a second metal layer comprising aluminum in a second plasma reactor utilizing capacitive coupling of power into said second reactor to form a plasma.

21. The method of claim 20, wherein said step of PVD depositing said barrier layer is performed in a third plasma reactor utilizing inductively coupled RF power into said third plasma reactor.

22. The method of claim 20, wherein said third step does not comprise inductively coupling power into said second reactor.

23. The method of claim 20, wherein second step is performed under conditions of a high-density plasma, wherein said high-density plasma is a plasma substantially filling an entire volume it is in and having an average ion density of greater than $10^{11} cm^{-3}$ in a principal portion of said high-density plasma.

24. The method of claim 20, further comprising a first transferring step performed between said second and third PVD depositing steps for transferring said substrate between said first and second plasma reactors under reduced pressure.

25. The method of claim 20, wherein said first PVD depositing step is performed in a third plasma reactor and wherein said method further comprises a second transferring step performed between said first and second PVD depositing steps of transferring said substrate between said third and second plasma reactors under reduced pressure.

26. A method of filling a hole formed in a dielectric layer, comprising the sequential steps of:

a first step of PVD depositing a barrier layer comprising a barrier metal and nitrogen and covering a bottom and side walls of said hole;

a second step of PVD depositing in said hole a first metal layer comprising a conductive metal in a first plasma reactor utilizing inductive coupling of RF power into said first reactor; and a third step of PVD depositing a second metal layer comprising said conductive metal in a second plasma reactor utilizing capacitive coupling of power into said reactor.

27. The method of claim 26, wherein said step of PVD depositing said barrier layer is performed in a third plasma reactor utilizing inductively coupled RF power into said third plasma reactor.

28. The method of claim 26, wherein said barrier metal comprises titanium and said conductive metal comprises aluminum.

29. The method of claim 26, wherein said barrier metal comprises a refractory metal selected from the group consisting of tantalum, cobalt, tungsten, and nickel.

30. The method of claim 29, wherein said barrier metal comprises tantalum.

31. The method of claim 26, wherein said conductive metal comprises copper.

* * * * *